United States Patent [19]

Ott

[11] Patent Number: 4,689,575
[45] Date of Patent: Aug. 25, 1987

[54] CLOCK SYNCHRONIZATION CIRCUIT FOR A COMPUTER TIMER

[75] Inventor: Russell G. Ott, Cranford, N.J.

[73] Assignee: RCA Corporation, Somerville, N.J.

[21] Appl. No.: 755,012

[22] Filed: Jul. 15, 1985

[51] Int. Cl.[4] .......................... H03K 1/17; H03K 7/00; H03K 17/00

[52] U.S. Cl. ......................................... 328/63; 328/72; 328/109; 307/480; 307/269; 377/78; 377/30

[58] Field of Search ............... 307/239, 529, 269, 480; 377/78, 30, 23, 37; 328/63, 72, 109

[56] References Cited

U.S. PATENT DOCUMENTS

| | | | |
|---|---|---|---|
| 3,469,390 | 9/1969 | Zimmer | 368/58 |
| 4,341,950 | 7/1982 | Kyles et al. | 377/78 |
| 4,417,158 | 11/1983 | Ito et al. | 307/269 |
| 4,423,383 | 12/1983 | Svendsen | 328/63 |

*Primary Examiner*—Stanley D. Miller
*Assistant Examiner*—Timothy P. Callahan
*Attorney, Agent, or Firm*—S. C. Corwin; R. E. Smiley; H. I. Schanzer

[57] ABSTRACT

A timing system which includes a timer circuit, a source of first clock pulses for advancing the timer circuit, and a circuit for reading out the timer circuit in synchronism advanced therewith and where there is also included a second source of clock pulses asynchronous with respect to the first source of clock pulses, a synchronizing circuit is provided for storing an indication of the receipt of each second clock source pulse. Then the timer is advanced only when a pulse is produced by the first clock source and the indication is present that a signal has been produced by the second clock source.

7 Claims, 3 Drawing Figures

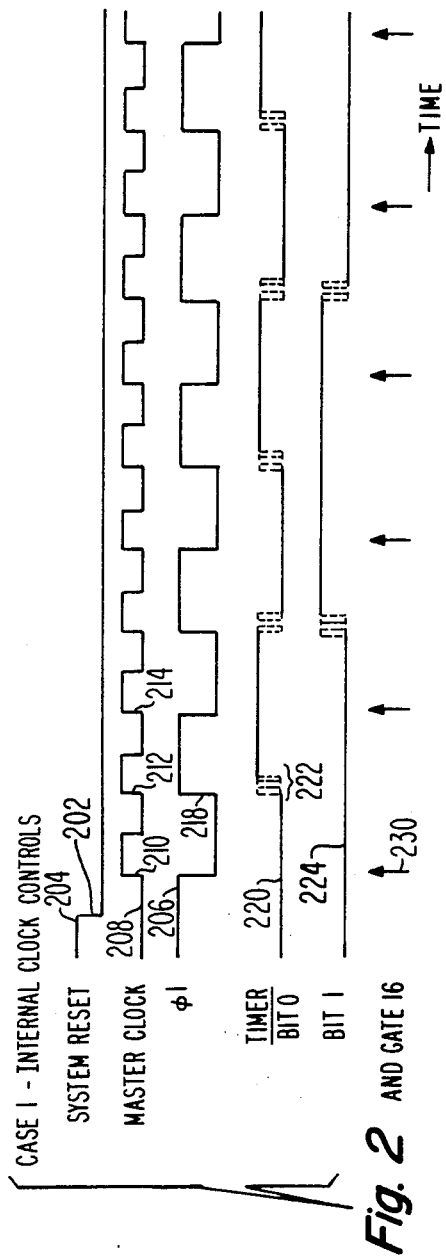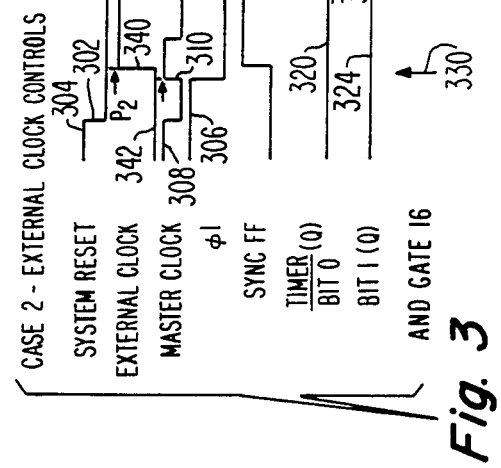

CLOCK SYNCHRONIZATION CIRCUIT FOR A COMPUTER TIMER

BACKGROUND OF INVENTION

1. Field of Invention

This invention is concerned with a circuit for controlling the advance of a timer circuit with a source of clocked pulses and, in particular to such a circuit, where there is, in addition, a second source of clocked pulses for advancing the timer which is not synchronized to the first source of clocked pulses.

2. Description of the Prior Art

Many single-chip microcomputers (CPU's) include one or more timers or timer-counters. These timers are advanced in synchronism with the microcomputer master clock signal and are read by executing an appropriate microcomputer timer read instruction. The read instructions are performed synchronously with the CPU's internal clocking signals so that the value in the timer is valid (i.e., a stable count) at the time when a read of the timer could occur. Such synchronization is available because the signal which advances the timer is synchronized with the signal which reads the timer value.

In some configurations the timer is clocked by an external clock, which may be completely asynchronous with the internal microcomputer clock pulses. In such situations the timer may produce an inaccurate readout when read with a signal synchronized with the internal clock signals. Alternatively elaborate synchronizing circuitry is required to ensure that the time readout is correct.

SUMMARY OF THE INVENTION

In a timing system which includes a timer circuit, first clocking means for producing time spaced signals for periodically advancing the timer and means for, upon command, reading out the contents of the timer, the readout being at times which are synchronized with and delayed after the timer advances such that the timer is producing stable signals when the readout occurs and wherein the timing system is also receptive of a second clocking means for producing time spaced signals which are asynchronous with respect to those produced by the first clocking means, the improvement comprising in combination means receptive of each second clocking means signal for storing an indication of the reception thereof; means receptive concurrently of the stored indication and of the next occurring pulse of the first clocking means pulses for advancing the timer and means responsive to the advance of the timer for releasing the stored indication.

BRIEF DESCRIPTION OF THE DRAWING

FIGS. 2 and 3 are sets of waveforms useful in understanding the operation of the system illustrated in FIG. 1 in its prior art mode of operation and in its inventive mode of operation respectively.

DETAILED DESCRIPTION OF A PREFERRED EMBODIMENT

Figure 1:
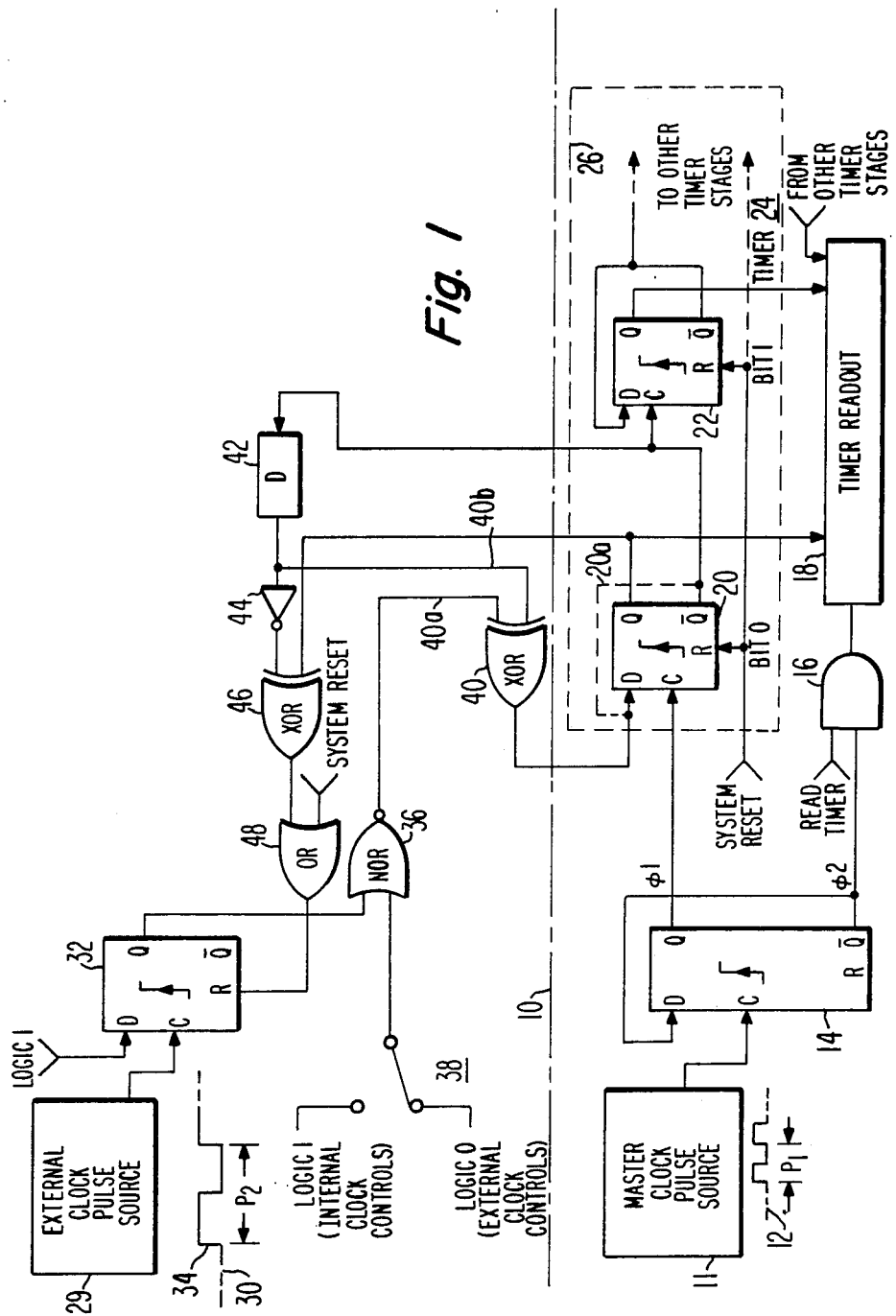
FIG. 1 is a timing system including a synchronization circuit in accordance with a preferred embodiment of the present invention.

Referring now to FIG. 1 all elements below line 10 are part of a conventional timing system such as utilized in a conventional microprocessing circuit. All elements above line 10 constitute the invention in accordance with a preferred embodiment thereof. Only those microprocessor circuit elements which are essential to describing the operation of the invention are illustrated in FIG. 1.

A master clock pulse source 11 produces periodic pulses as illustrated in FIG. 1 having a period $P_1$. A D-type flip-flop 14 is receptive at its C input of the periodic pulses generated by source 11 within the microprocessing circuit. A D-type flip-flop is characterized by the production at its Q output of a signal having the same value as the signal applied to its D input when the C input receives a negative-to-positive voltage transition (NPT). In accordance with established tradition a logic 0 represents a relatively low voltage signal and a logic 1 represents a relatively high voltage signal. In a particular application these signal values could be reversed. The QN output of flip-flop 14 which is always opposite in logic value from its Q input, is connected to the D input thereof. (It is to be understood that, although the letter Q with the bar above it is illustrated in flip-flop 14 and others to be described in accordance with drawing convention, in the description the symbol QN will be used.) Because the QN output of flip-flop 14 is tied to the D input, flip-flop 14 toggles between a logic 0 and a logic 1 at its Q output upon receipt of each NPT at its C input.

The QN output of flip-flop 14 is also coupled to one input of AND gate 16. A read timer signal (produced within the microprocessor) is coupled to a second input of AND gate 16. The output of AND gate 16 is coupled to a timer readout buffer 18. The Q output of flip-flop 14 is coupled to the C input of D-type flip-flop 20.

Flip-flop 20, flip-flop 22 and others (not shown) are part of a timer circuit 24 illustrated within dashed box 26. The timer circuit includes flip-flops (not shown) in addition to Bit 0 and Bit 1 flip-flops 20 and 22. A typical total number of flip-flops is 16. The Q output of flip-flops 20 and 22 and outputs of other flip-flops (not shown) are coupled to timer readout buffer 18. The QN output of flip-flop 20 is coupled to the C input of flip-flop 22. Its QN output is coupled to the C input of the next flip-flop stage (not shown) and this process continues for as many flip-flop stages as are present in timer 24. The QN output of each timer flip-flop is coupled back to its D input as exemplified by flip-flop 22. The dashed connection 20a between the QN output of flip-flop 20 and its D input is present in accordance with conventional design but is not present in accordance with the instant invention.

A system reset signal generated within the microprocessing circuit, of which the timer circuit below line 10 is a part, is connected to the R (reset) inputs of each of flip-flops 20, 22, and others not illustrated.

Operation of the timing circuit described thus far, that is, those elements below dashed line 10 in FIG. 1, will now be given with reference as appropriate to the waveforms of FIG. 2. The waveforms and parts thereof of FIG. 2 will hereinafter be referred to as waveform 2xx or pulse 2xx or transition 2xx where xx represents an appropriate two digit number. Thus for example the positive-to-negative transition 202 of system reset waveform 204 resets flip-flops 20, 22 and others (not shown) in timer circuit 24. At the time of transition 202 it will be assumed that flip-flop 14 is set, meaning that its Q output is a logic 1. See $\phi 1$ waveform 206. Then successive master clock waveform 208 NPT's pulses 210, 212, 214 etc. toggle flip-flop 14 between its set and reset states. That is flip-flop 14, in response to master clock 11 pulses, toggles between a logic 1 and a logic 0 at its Q output (see waveform 206) and between a logic 0 and a logic 1 at its QN output. It will be realized that the QN output although not shown in FIG. 2 is complimentary to that at the Q output. Every time that flip-flop 14 toggles from a logic 0 to a logic 1 at its Q output such as at point 218 on waveform 206, timer flip-flop 20 is responsive to the resulting NPT at its C terminal to change state—set to reset or reset to set. Every time flip-flop 20 changes from a set to a reset condition such that the QN output transfers from a logic 0 output to a logic 1 output, flip-flop 22 (bit 1 of timer 24) is toggled from set to reset or vise versa. See waveform 224. Thus, for example, NPT 218 causes flip-flop 20 (also called timer bit 0) to change from reset to set (Q output changes from logic 0 to logic 1) as illustrated in bit 0 waveform 220 in region 222. The reason that region 222 is a region and not a point in time is that flip-flop 20, as is true of all flip-flops, takes a finite amount of time to change state. If the contents of timer 24 were to be accessed during time region 222, the output results would be unpredictable.

However access occurs only when AND gate 16 is enabled. AND gate 16 is enabled only when the QN output of flip-flop 14 is a logic 1 and a logic 1 is present from the read timer signal. The read timer signal is present only when a software instruction is given to read the contents of timer 24 for some desired purpose. The arrows in the same row as arrow 230 indicate those times when AND gate 16 can be enabled but do not necessarily indicate that AND gate 16 is enabled at those times. It is to be noted that the arrows occur only at times when flip-flop 14 is transitioning from a Q output at a logic 1 to a logic 0. These are times when flip-flops 20, 22 and other timer 24 flip-flops are not changing state and therefore are in a stable condition.

In summary the timer circuit works correctly if the time of timer readout is synchronized with timer advance as is the case where, in effect, master clock 11 pulses both advance the timer by means of the Q output of flip-flop 14 and determine the timer of timer readout by the QN output of flip-flop 14.

Assume for a moment however that the QN output of flip-flop 14 is not connected to AND gate 16 but rather AND gate 16 is connected to receive pulses from an external source which is in no way synchronized to clock pulses governing the changing of state of flip-flop 14. In such a case it will often happen that a timer 24 read out will occur just as flip-flop 20 and perhaps other flip-flops such as flip-flop 22 of timer 24 is/are changing state, that is, times when the flip-flop(s) may either be set or reset and thus may give an erroneous output.

It is the purpose of the instant invention to prevent such a problem from occuring. In that connection reference is now made to the portion of FIG. 1 above line 10. There is a source of external clock pulses from source 29, as indicated by waveform 30 and having a period $P_2$ is applied to the C input of a D-type flip-flop 32. A logic 1 signal is applied to the D input thereof to insure that each time an NPT such as 34 is received at the C input of flip-flop 32 its Q output will go to a logic 1.

The Q output of flip-flop 32 is coupled to one input of a NOR gate 36. The second input to NOR gate 36 comes from a single-pole double-throw switch 38 which connects either a logic 1 signal to NOR gate 36 or a logic 0 signal to NOR gate 36. When it is desired that control of timer 24 is by means of internal clock 11, a logic 1 is applied to NOR gate 36. When it is desired that control of timer 24 is by means of the external clock 29, a logic 0 is applied to NOR gate 36.

The output of NOR gate 36 is coupled to one input of an exclusive OR gate (XOR gate) 40. The output of XOR gate 40 is coupled to the D input of timer bit 0 flip-flop 20. In this instance the connection indicated by dashed line 20a is not present. The QN output of flip-flop 20 is coupled to a delay 42. Delay 42 is a relatively short delay much shorter for example than the period $P_1$ of master clock pulses 12. Its purpose will be discussed hereinafter. The output of delay 42 is coupled to an inverter 44 and to a second input of XOR gate 40. The Q output of Bit 0 or least significant bit flip-flip 20 and the output of inverter 44 are coupled to respective inputs of a second XOR gate 46. Its output and the system reset signal (the same one that is coupled to flip-flops 20 and 22) are coupled to respective inputs of OR gate 48. The output of OR gate 48 is coupled to the R (reset) input of synchronizing flip-flop 32.

Operation of the entire timing system of FIG. 1 will now be described with reference as necessary to FIG. 3. Several of the waveforms of FIG. 3 are duplicative of the waveforms of FIG. 2 and are similiarly legended but with a hundreds digit of 3 rather than 2. Assuming initially that synchronizing flip-flop 32 is in its reset condition such that its Q output is a logic 0 and that switch 38 is positioned as illustrated, that is connected to a source producing a logic 0 signal, XOR gate 40 receives from its input lead 40a a logic 1 signal. Assuming further that timer flip-flop 20 is reset such that its QN output is a logic 1, input 40b to XOR gate 40 is a logic 1. An exclusive OR circuit has the property that if either but not both of its inputs are a logic 1 the output is a logic 1. In all other combinations that is both logic 0's into the XOR gate or both logic 1's into the XOR gate its output is a logic 0.

In accordance with the initial assumed conditions, the output of XOR gate 40 is a logic 0 which is input to the D input of flip-flop 20. Assume further that under these conditions, an NPT from master clock pulse source 11 (see waveform 308, NPT 360) is applied to the C input of flip-flop 14 causing its Q output to change from a logic 0 to a logic 1 (See waveform 306, NPT 362). The resulting NPT from the Q output of flip-flop 14 is applied to the C input of flip-flop 20. It will be remembered that upon receipt of an NPT at the C input of a D-type flip-flop its Q output takes on the value of the D input. Therefore in the example the Q output of flip-flop 20 would continue to be at a logic 0 since the D input is at a logic 0. (See waveform 320, portion 345.)

Now assume that an NPT occurs at the C input of synchronizing flip-flop 32. This is illustrated for example by NPT 34 of waveform 30 in FIG. 1 or NPT 340 of waveform 342 in FIG. 3. When NPT 340 occurs, flip-flop 32 changes state from reset to set such that its Q output changes from a logic 0 to a logic 1. Thus the input on connection 40a to XOR gate 40 is a logic 0. Flip-flop 20 is still assumed to be reset. Therefore, the second connection 40b to XOR gate 40 remains at a logic 1. As a result the output from XOR gate 40 is a logic 1 which is applied to the D input of flip-flop 20. When the next occuring NPT (312) of waveform 308 (FIG. 3) occurs, the resulting NPT 318 from the Q output of flip-flop 14 applied to the C input of flip-flop 20 causes the flip-flop to change state, as indicated by portion 322 of waveform 320.

It is important to note that flip-flop 20 changes state only upon receipt of an NPT from flip-flop 14 and that flip-flop 14 produces an NPT only upon receipt of an NPT from master clock pulse source 11. Thus although an NPT from external clock source 29 primes flip-flop 20 to change state, the timing of the change of state is strictly a function of the timing of master clock pulse source 11.

Following the change of state of flip-flop 20 as indicated by waveform portion 322 from a reset to a set condition, the resulting logic 1 output from the Q output of flip-flop 20 applied to XOR gate 46 causes XOR gate 46 to produce a logic 1 signal which is applied to OR gate 48. The resulting logic 1 signal from OR gate 48 resets flip-flop 32. A short time after flip-flop 20 is changed in state from reset to a set condition and has settled down, the resulting logic 0 at the QN output thereof causing a logic 0 signal to appear at the output of delay 42 and therefore a logic 1 to appear at the output of inverter 44.

The logic 1 signal at the output of inverter 44 coupled with the logic 1 signal from the Q output of flip-flop 20 causes XOR gate 46 to produce a logic 0 signal, thereby removing the reset signal from flip-flop 32. The resulting logic 0 signal from flip-flop 20 delayed by delay 42 is aplied to input 40b of XOR gate 40. Since synchronizing flip-flop 32 is reset, its Q output is a logic 0 which results in a logic 1 output from a NOR gate 36 and therefore a logic 1 signal being applied on input 40a of XOR gate 40. The resulting logic 1 signal from XOR gate 40 is applied by the output of XOR gate 40 to the D input of flip-flop 20.

When the next NPT occurs from the Q output of flip-flop 14, (designated 319 in FIG. 3) no change of state of flip-flop 20 occurs. This is true since flip-flop 20 is set thus producing a logic 1 at its Q output and since XOR gate 40 is also producing a logic 1 which is applied to the D input of flip-flop 20.

When the next NPT from the external clock occurs as illustrated at point 344 in FIG. 3, XOR gate 40 receives on input 40a a logic 0 signal and receives on input 40b a logic 0 signal causing XOR gate 40 to produce at the D input of flip-flop 20 a logic 0 signal. Thereafter the next successive NPT from flip-flop 14 that indicated as 321 in FIG. 3 causes flip-flop 20 to change state from set to a reset condition. Also the resulting NPT from the QN output of flip-flop 20 causes timer flip-flop 22 (bit 1) to change state from reset to set. See waveform 324 region 370.

The process above described repeats such that timer 24 and more particularly flip-flop 20 thereof changes state only when an NPT of an external clock pulse appears at synchronizing flip-flop 32 and thereafter an NPT occurs from flip-flop 14. As a result whenever a read timer signal occurs at AND gate 16, readout will only occur when flip-flop 14 is set and that condition only occurs in synchronizon with the internal master clock pulse signals as indicated by waveform 12 FIG. 1.

The only requirement for external clock pulses as indicated by waveform 30 relative to internal master clock pulses as indicated by waveform 12 is that $P_2$ be greater than $P_1$. In one constructive embodiment due to constraints not shown in the structure of FIG. 1 conditions were such that $P_2$ needed to be greater than two times $P_1$. In the waveforms of FIG. 3 the period of $P_2$ of the external clock signal is illustrated as being roughly two and a quarter times the period $P_1$ of the master clock.

What is claimed is:

1. In a timing system which includes a timer circuit storing an alterable value therein, first clocking means for producing a first series of time spaced signals for periodically altering the value stored in said timer circuit and means for, upon command, reading out the value of said timer circuit, the readout being at times which are synchronized with and delayed after the timer circuit is altered such that the timer circuit is producing stable signals when the readout occurs and wherein the timing system is also receptive of signals from a second clocking means for producing a second series of time spaced signals which are asynchronous with respect to those of said first series, the improvement comprising in combination:

signal storage means coupled to said second clocking means receptive of each second series signal for storing an indication of the reception thereof;

said timer circuit including means coupled to said signal storage means receptive concurrently of the stored indication and of the next occurring signal of the first series for altering the values of said timer circuit whereby said timer circuit is altered in synchronism with said first series signal;

means coupled between said timer circuit and said signal storage means responsive to the alteration of said timer circuit value for releasing said stored indication in said signal storage means.

2. The combination as set forth in claim 1 wherein said signal storage means comprises a flip-flop having an input terminal coupled to said second clock means.

3. The combination as set forth in claim 1 wherein said timer circuit is a counter comprised of a plurality of stages, each having an output terminal, one stage of which corresponds to a least significant bit of said timer circuit and wherein said means responsive to the alteration of said timer circuit value comprises means responsive to the alteration of said least significant bit stage value.

4. The combination as set forth in claim 3 wherein said least significant bit timer circuit stage comprises a flip-flop having Q and QN output terminals providing complementary signals and wherein at least one of said Q and QN output terminals is coupled to said means for releasing said stored indication.

5. The combination as set forth in claim 4 wherein said means for releasing said stored indication comprises an exclusive OR gate having an input coupled to receive the signals from said Q or QN output of said flip-flop.

6. The combination as set forth in claim 5 wherein said means for storing an indication comprises a flip-flop having an input terminal coupled to said second clock means.

7. The combination as set forth in claim 6 wherein said flip-flop includes a reset input terminal and wherein the output of said exclusive OR gate is coupled to said reset input terminal of said flip-flop.

* * * * *